US008642470B2

(12) United States Patent
Bao (10) Patent No.: US 8,642,470 B2
(45) Date of Patent: Feb. 4, 2014

(54) SEMICONDUCTOR DEVICE MANUFACTURING METHOD

(75) Inventor: Yu Bao, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/316,192

(22) Filed: Dec. 9, 2011

(65) Prior Publication Data

US 2013/0078805 A1 Mar. 28, 2013

(30) Foreign Application Priority Data

Sep. 22, 2011 (CN) .......................... 2011 1 0282910

(51) Int. Cl.
*H01L 21/00* (2006.01)
*H01L 21/44* (2006.01)
(52) U.S. Cl.
USPC .................... 438/675; 438/689; 257/E21.001
(58) Field of Classification Search
USPC ......................................................... 438/618
See application file for complete search history.

(56) References Cited

U.S. PATENT DOCUMENTS

| 5,792,706 | A  | * | 8/1998 | Michael et al. ............. 438/626 |
| 6,159,840 | A  | * | 12/2000 | Wang ........................... 438/618 |
| 6,984,577 | B1 | * | 1/2006 | Zhao et al. .................... 438/619 |
| 7,078,814 | B2 | * | 7/2006 | Stamper ....................... 257/760 |
| 7,544,602 | B2 | * | 6/2009 | Clevenger et al. ............ 438/619 |
| 7,898,057 | B2 | * | 3/2011 | Davies et al. ................. 257/522 |
| 8,034,693 | B2 | * | 10/2011 | Shibata et al. ................ 438/422 |
| 2004/0097013 | A1 | * | 5/2004 | Lur et al. ...................... 438/118 |
| 2005/0263896 | A1 | * | 12/2005 | Lur et al. ...................... 257/758 |
| 2007/0076339 | A1 | * | 4/2007 | Lur et al. ......................... 361/56 |
| 2010/0133699 | A1 | * | 6/2010 | Werner et al. ................. 257/774 |
| 2011/0104891 | A1 | * | 5/2011 | Al-Bayati et al. ............ 438/643 |
| 2011/0108992 | A1 | * | 5/2011 | Chanda et al. ................ 257/773 |
| 2011/0309517 | A1 | * | 12/2011 | Miki et al. .................... 257/774 |
| 2012/0132985 | A1 | * | 5/2012 | Kai et al. ...................... 257/326 |

OTHER PUBLICATIONS

Fluorine ion implantation into silicon dioxide to form stable low-k intermetal dielectric films; Ion Implantation Technology, 2000. Conference on; Essaian, S. Nat. Semicond. Corp., Santa Clara, CA Rosenblatt, D.H.*
Stability of Carbon-Doped Silicon Oxide Low-k Thin Films Y. H. Wang and R. Kumar; J. Electrochem. Soc. 2004, vol. 151, Issue 4, pp. F73-F76.*

* cited by examiner

*Primary Examiner* — Seahvosh Nikmanesh
*Assistant Examiner* — Evren Seven
(74) *Attorney, Agent, or Firm* — Koppel Patrick Heybl & Philpott (57) ABSTRACT

The present invention provides a semiconductor device manufacturing method. This method comprises: etching a first dielectric layer to form a recess; depositing a second dielectric layer over said first dielectric layer and said recess, such that said recess is enclosed by said first dielectric layer and said second dielectric layer to form an air gap; and performing etching, such that a first trench is formed in said first dielectric layer and said second dielectric layer, adjacent to said air gap. The first trench can be filled with a conductive material to form wiring.

4 Claims, 9 Drawing Sheets

PRIOR ART

Fig. 1a

PRIOR ART

Fig. 1b

PRIOR ART

SEMICONDUCTOR DEVICE MANUFACTURING METHOD

CROSS-REFERENCE TO RELATED APPLICATIONS

This application claims priority to Chinese Patent Application No. 201110282910.X, filed on Sep. 22, 2011 and entitled "Semiconductor Device Manufacturing Method", which is incorporated herein in its entirety by reference.

FIELD OF THE INVENTION

The present invention relates to a semiconductor device manufacturing method. More specifically, the present invention relates to a method of manufacturing a semiconductor device having an air gap.

DESCRIPTION OF THE RELATED ART

As integrated circuit (IC) technology is developing, a major factor limiting the speed of a semiconductor device is no longer the transistor delay, but the resistance-capacitance (RC) delays associated with the conductive material (e.g. metal) interconnects. With this realization, a great deal of work has been done for researching and developing innovative materials and fabrication technologies to reduce the capacitance and thus the RC delays of the conductive material interconnects. For example, as a dielectric material in the conductive material interconnects, a dielectric material of a low dielectric constant (also known as a low-dielectric-constant material) can be preferably adopted.

Moreover, an approach of forming air gaps between conductive materials to further reduce the dielectric constant and thus the capacitance between conductive materials has been researched and developed. Air gaps can be formed between conductive material wirings by making use of the so-called "selective deposition characteristic" of chemical vapour deposition (CVD). Also, air gaps can be formed by removing a sacrificial layer during operation of a specific process for constructing one or more conductive material wirings.

Figure 1A:
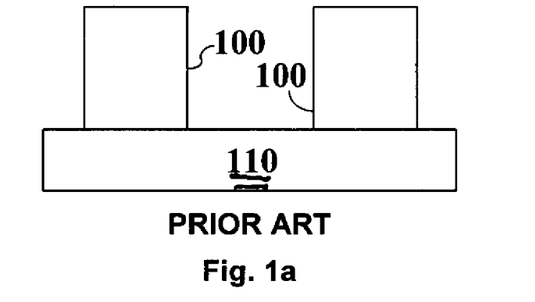
FIGS. 1a-1c are views schematically showing a prior art method of forming an air gap between conductive materials.
Figure 1B:
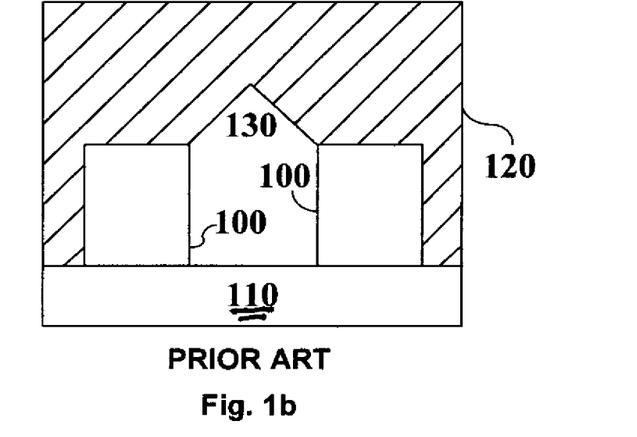

FIGS. 1a and 1b show a method of forming an air gap between conductive materials (conductive material wirings or conductive material vias) 100. As shown in FIG. 1a, first, a plurality of conductive material wirings or conductive material vias are formed on a layer 110. As shown in FIG. 1b, a dielectric material 120 is deposited to form an air gap 130 between adjacent conductive material wirings or conductive material vias 100 by making use of the selective deposition characteristic of the CVD.

SUMMARY OF THE INVENTION

Figure 1C:
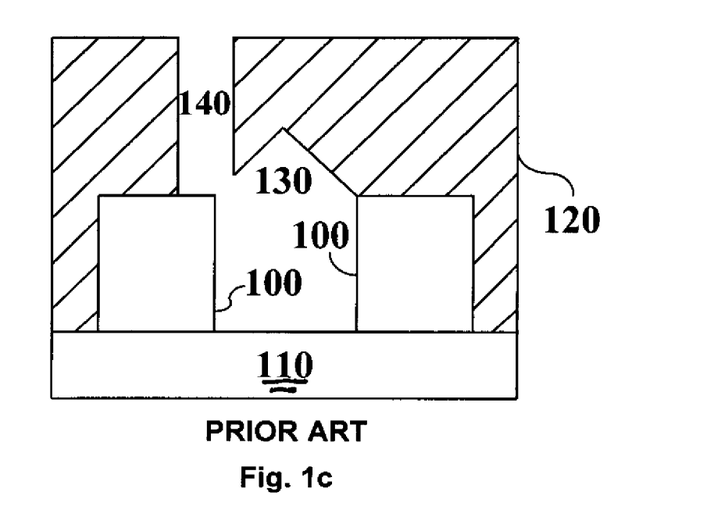

According to the prior art method of forming the air gap as shown in FIGS. 1a and 1b, the top end of the air gap 130 is always higher than the top of the conductive material wirings or the conductive material vias 100. As shown in FIG. 1c, in a situation where another conductive material via that interconnects with the conductive material wiring or the conductive material via 100 is to be formed, if a mask is not accurately aligned, a through hole 140 for forming the other conductive material via may shift to communicate with the air gap 130.

Thus, new technology needs to be provided to address the above technical problem existing in the prior art.

According to one aspect of the present invention, there is provided a semiconductor device manufacturing method, comprising: (a) etching a first dielectric layer to form a recess, wherein said first dielectric layer is formed of a first dielectric material; (b) depositing a second dielectric material over said first dielectric layer and said recess to form a second dielectric layer, such that said recess is enclosed by said first dielectric layer and said second dielectric layer to form an air gap; and (c) etching, such that a first trench is formed adjacent to said air gap in said first dielectric layer and said second dielectric layer.

According to a possible implementation, said semiconductor device manufacturing method can further comprise: (d) filling a first conductive material into said first trench.

According to a possible implementation, said semiconductor device manufacturing method can further comprise: (j) etching said first trench to form a first through hole, wherein said first trench and said first through hole communicate with each other and penetrate said first dielectric layer and said second dielectric layer.

According to a possible implementation, said semiconductor device manufacturing method can further comprise: (l) filling the first conductive material into said first trench and said first through hole.

According to a possible implementation, said semiconductor device manufacturing method can further comprise: (k) before step (a), forming said first dielectric layer on a first blocking layer. The first through hole formed in the step (j) can penetrate said first blocking layer.

According to a possible implementation, said semiconductor device manufacturing method can further comprise: (e) performing a chemical mechanical planarization on said first conductive material such that a surface obtained through the planarization is higher than the top end of said air gap.

According to a possible implementation, said semiconductor device manufacturing method can further comprise: (f) forming a second blocking layer on the surface obtained through said chemical mechanical planarization.

According to a possible implementation, said semiconductor device manufacturing method can further comprise: (g) forming a third dielectric layer on said second blocking layer; (h) etching said third dielectric layer to form a second trench and a second through hole that communicates with said second trench, wherein said second trench and said second through hole penetrate said third dielectric layer and said second blocking layer, wherein the lower end of said second through hole is substantially flush with the top end of said first conductive material; and (i) filling a second conductive material into said second trench and said second through hole.

According to a possible implementation, said second conductive material and said first conductive material can be the same conductive material. Said conductive material can be, for example, copper.

According to a possible implementation, said first dielectric material and said second dielectric material can be a same low-dielectric-constant material whose relative dielectric constant is lower than 3.0. Said low-dielectric-constant material can comprise, for example, silicon oxide and carbon; or, said low-dielectric-constant material can comprise, for example, silicon oxide and fluorine.

According to another aspect of the present invention, there is provided a semiconductor device manufacturing method, comprising: (a) etching a first dielectric layer to form a plurality of recesses, wherein said first dielectric layer is formed of a first dielectric material; (b) depositing a second dielectric material over said first dielectric layer and said plurality of recesses to form a second dielectric layer, such that said plurality of recesses are enclosed by said first dielectric layer and said second dielectric layer to form multiple air gaps; and (c) performing etching, such that first trenches are formed between adjacent air gaps of said multiple air gaps in said first dielectric layer and said second dielectric layer.

According to a possible implementation, said semiconductor device manufacturing method can further comprise: (d) filling a first conductive material into said first trenches.

According to a possible implementation, said semiconductor device manufacturing method can further comprise: (j) etching said first trenches to form through holes, wherein said first trenches and said through holes communicate with each other and penetrate said first dielectric layer and said second dielectric layer.

According to a possible implementation, said semiconductor device manufacturing method can further comprise: (l) filling the first conductive material into said first trenches and said through holes.

According to a possible implementation, said semiconductor device manufacturing method can further comprise: before the step (a), forming said first dielectric layer on a first blocking layer. The through holes formed in the step (j) can, for example, penetrate said first blocking layer.

Further features and advantages of the present invention will become apparent from the following detailed description of exemplary embodiments of the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The accompanying drawings illustrate embodiments of the invention and are not intended to limited the scope thereof. With reference to these drawings and based on the following detailed description, the present invention can be more clearly understood. In the figures.

DESCRIPTION OF THE EMBODIMENTS

Various exemplary embodiments of the present disclosure will now be described in detail with reference to the drawings. It should be noted that the relative arrangement of the components and steps, the numerical expressions, and numerical values set forth in these embodiments do not limit the scope of the present invention unless it is expressly stated otherwise.

In the following description, for the purpose of explanation, a great amount of particular details are elaborated on so as to provide a more thorough understanding of the present invention. However, the present invention can be implemented without one or more of these particular details. Moreover, in order to avoid redundant descriptions from concealing or obscuring the essence of the present invention, known structures and apparatuses will not be described in detail.

Further, it should be understood that, for the convenience of description, each component in the figures has not been necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

It is to be noted that similar reference numerals and letters refer to similar items in the figures, and thus once an item is defined in one figure, it is possible that it need not be further discussed for subsequent figures.

In the present disclosure, the term "interconnects" means various conductive material components for electrical connection. The "interconnects" can include "wirings" or "vias". "Wiring" means a conductive material layer having a certain shape or pattern. "Via" means a hole having a conductive material filled therein and used for electrical connection between wirings.

In the present disclosure, the term "semiconductor device" means a device comprising a semiconductor material, which can include not only a finished semiconductor device product, but also a semi-finished product of a semiconductor device during manufacturing or processing.

Figure 2A:
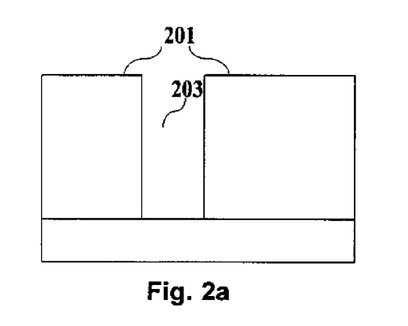
FIGS. 2a-2i are cross-sectional views schematically showing a process flow of an example of a semiconductor device manufacturing method incorporating features of the present invention.
Figure 2B:
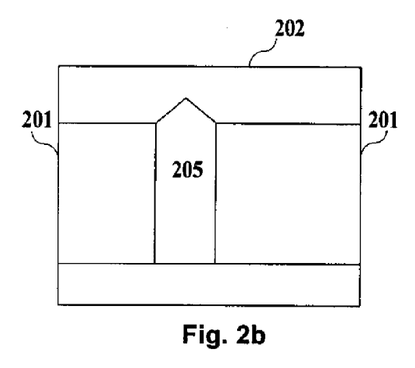
Figure 2C:
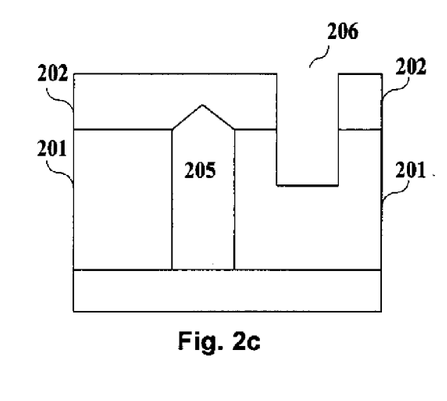

FIGS. 2a-2c are cross-sectional views schematically showing a process flow of an example of a semiconductor device manufacturing method according to the present invention.

As shown in FIG. 2a, a semiconductor device manufacturing method according to the present invention can comprise step (a) in which a first dielectric layer 201 is etched to form a recess 203, wherein said first dielectric layer 201 is formed of a first dielectric material. As shown in FIG. 2b, after step (a), step (b) can be carried out in which a second dielectric material is deposited over said first dielectric layer 201 and said recess 203 to form a second dielectric layer 202, such that said recess 203 is enclosed by said first dielectric layer 201 and said second dielectric layer 202 to form an air gap 205. As shown in FIG. 2c, after step (b), step (c) can be carried out in which etching is performed such that a first trench 206 is formed in the first dielectric layer 201 and the second dielectric layer 202, adjacent to the air gap 205.

According to a possible exemplary implementation, the first dielectric material and the second dielectric material can be the same low-dielectric-constant material (low-k material). The relative dielectric constant of the low-dielectric-constant material can be lower than 3.0, for example.

According to a possible exemplary implementation, said low-dielectric-constant material can comprise, for example, silicon oxide and carbon (such as carbon-containing $SiO_2$).

According to a possible exemplary implementation, said low-dielectric-constant material can comprise, for example, silicon oxide and fluorine (such as fluorine-containing $SiO_2$).

The silicon oxide mentioned above can be, for example, an amorphous oxide of silicon or a poly oxide of silicon. Said low-dielectric-constant material can also comprise a pore-forming agent.

According to a possible exemplary implementation, said first dielectric layer 201 can have a thickness of 200 Å-1000 Å, for example.

According to a possible exemplary implementation, before step (a), said first dielectric layer 201 can be formed on the first blocking layer. For example, said first dielectric layer 201 can be formed on the first blocking layer by means of chemical vapour deposition. For example, said first blocking layer can be at least one of silicon nitride, silicon carbide, carbon-containing silicon nitride and nitrogen-containing silicon carbide. Said first blocking layer can be formed using a method such as physical vapour deposition. At the time etching is performed to form the recess 203 in the step (a), said recess 203 does not penetrate said first blocking layer.

According to a possible exemplary implementation, in the aforementioned step (a), a resist pattern corresponding to said recess 203 can be formed by exposing, with a mask, said first dielectric layer 201 that is applied with resist. The etching for forming said recess 203 can be, for example, isotropic etching such as dry etching.

According to a possible exemplary implementation, in the aforementioned step (b), said second dielectric material can be deposited by a chemical vapour deposition (e.g. plasma enhanced chemical vapour deposition, PE-CVD) method to form said air gap 205.

According to a possible exemplary implementation, before the aforementioned step (c), a hard mask can be formed on said second dielectric layer 202, and then etching can be performed to form said first trench 206. The hard mask can be made of a dense material (such as, TEOS), so as to facilitate the control of the polishing speed in the subsequent chemical mechanical planarization.

According to a possible exemplary implementation, in the aforementioned step (c), a resist pattern corresponding to said first trench 206 can be formed by exposing, with a mask, the second dielectric layer 202 that is applied with resist. The etching for forming said first trench 206 can be, for example, isotropic etching such as dry etching.

According to a possible exemplary implementation, said first trench 206 can penetrate said second dielectric layer 202 and can be partially located in the first dielectric layer 201. Alternatively, said first trench 206 can penetrate both said second dielectric layer 202 and said first dielectric layer 201.

With the semiconductor device manufacturing method according to the present invention as shown in FIGS. 2a-2c, an air gap is formed in the first dielectric layer 201 that is located in a relatively low layer. Thus, if a conductive material is filled into the first trench 206, the top end of the wiring thus formed can be higher than the top end of the air gap, such that even if another conductive material via to be interconnected with the wiring is not aligned with the wiring, the through hole for forming the other conductive material via will not communicate with the air gap.

Figure 2D:
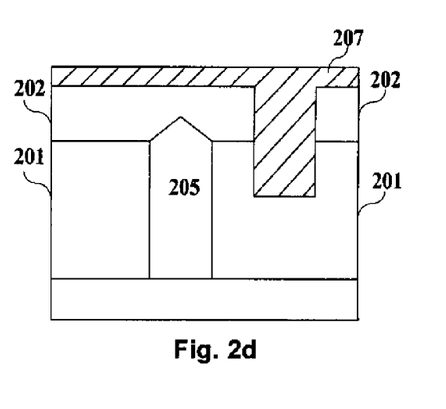

According to a possible exemplary implementation, as shown in FIG. 2d, after step (c), step (d) can be carried out in which a first conductive material 207 can be filled into said first trench 206. Said first conductive material 207 can be various conductive materials such as a metal, including but not limited to copper, aluminum or the like. Said first trench 206, which is filled with the first conductive material 207, can form a conductive material interconnect such as a wire structure.

According to a possible exemplary implementation, first, a seed layer of said first conductive material 207 can be formed by a physical vapour deposition method, and then said first conductive material 207 is further formed in said first trench 206 based on the seed layer by use of a chemical electroplating method.

According to a possible exemplary implementation, before forming the first conductive material 207, said first trench 206, which is formed by etching, can be cleaned and then a shielding layer (not shown) can be formed on the inner wall of said first trench 206. This shielding layer prevents the first conductive material 207, which is later formed from diffusing into the dielectric layers. For example, the shielding layer can comprise a mixture of tantalum and tantalum nitride or a mixture of titanium and titanium nitride. The shielding layer can be formed, for example, by a method such as physical vapour deposition (PVD).

Figure 2E:
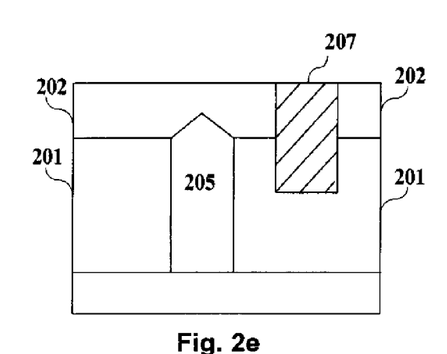

As shown in FIG. 2e, after step (d), step (e) can be carried out in which a chemical mechanical planarization can be performed on the first conductive material 207, such that a surface obtained through the planarization is higher than the top end of the air gap 205.

As described above, the top end of the first conductive material 207 can be higher than the top end of said air gap 205. Since a through hole for forming another conductive material via that is to be interconnected with said first conductive material 207 is etched to the level of the top end of the conductive material 207, this through hole is be etched so as to communicate with the air gap even if it is not aligned with the first conductive material 207. As such, it is possible to keep the air gap with a good low-dielectric-constant characteristic.

Figure 2F:
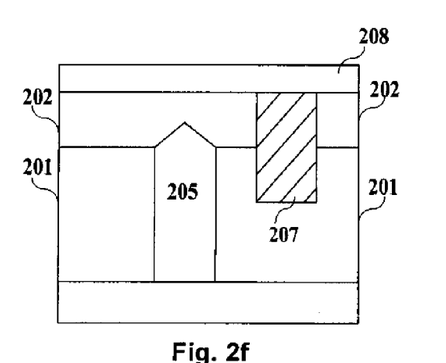

According to a possible exemplary implementation, as shown in FIG. 2f, after the step (e), step (f) can be carried out in which a second blocking layer 208 can be formed on the surface obtained through said chemical mechanical planarization. Said second blocking layer 208 can be for example at least one of silicon nitride, silicon carbide, carbon-containing silicon nitride and nitrogen-containing silicon carbide. Said second blocking layer 208 can be formed by a method such as physical vapour deposition. Said second blocking layer 208 can be used for electrically isolating the first conductive material 207 from other layers.

A second layer of wirings can be formed on said first layer of wirings that is formed by the processes shown in FIGS. 2a-2h. However, the method for forming said second layer of wirings is not limited to any particular method. For example, said second layer of wirings can be formed by the same method as the first layer of wirings (see FIGS. 4a-4e). The second layer of wirings also can be formed by a method different from that for said first layer of wirings.

Figure 2G:
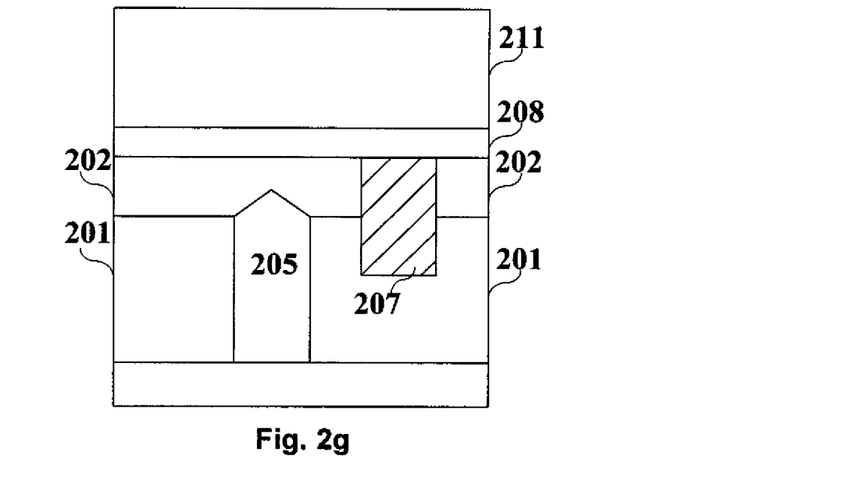
Figure 2H:
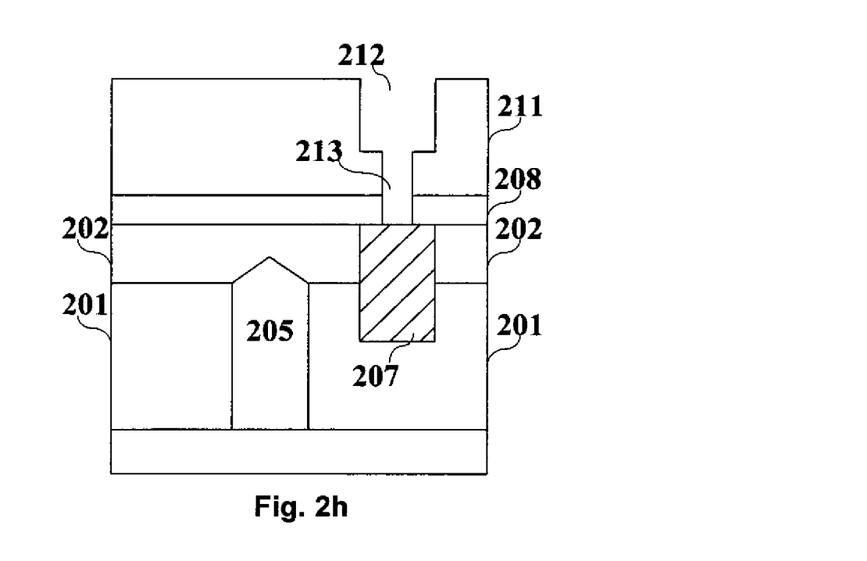
Figure 2I:
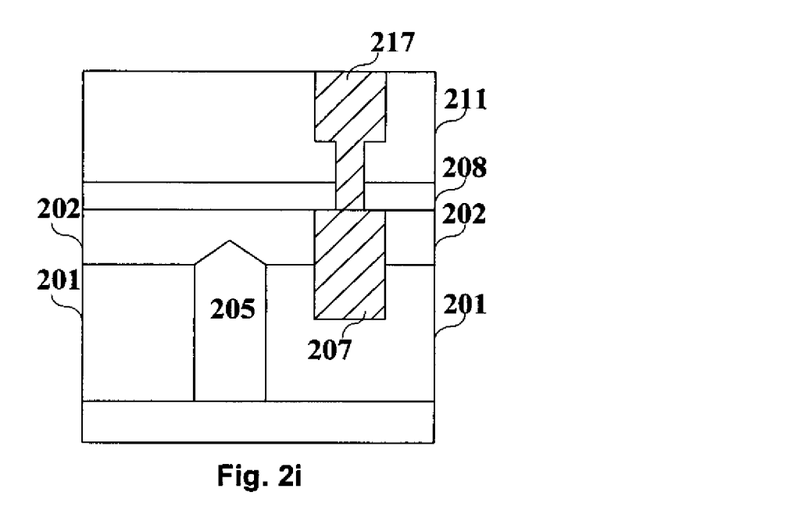

FIGS. 2g-2i schematically shows an exemplary method of forming a second layer of wirings on the first layer of wirings that is formed by the processes shown in FIGS. 2a-2h.

As shown in FIG. 2g, in step (g), a third dielectric layer 211 can be formed on said second blocking layer 208. As shown in FIG. 2h, in step (h), said third dielectric layer 211 can be etched to form a second trench 212 and a second through hole 213 that communicates with the second trench 212. Said second trench 212 and said second through hole 213 penetrate said third dielectric layer 211 and said second blocking layer 208, and the lower end of the second through hole 213 is substantially flush with the top end of the first conductive material 207 (i.e. the lower end of the second through hole 213 reaches the first conductive material 207). As shown in FIG. 2i, in step (i), a second conductive material 217 is filled into said second trench 212 and said second through hole 213 to form another wiring and via.

The methods such as deposition and etching of dielectric layers involved in the processes shown in FIGS. 2g-2i can be the same as or similar to the methods involved in the processes shown in FIGS. 2a-2f.

The material of said third dielectric layer 211 can be the same material as that for said first dielectric layer 201 and/or said second dielectric layer 202, or a material different from that for said first dielectric layer 201 and/or said second dielectric layer 202. Said second conductive material 217 and said first conductive material 207 can be the same conductive material or different conductive materials.

Figure 3:
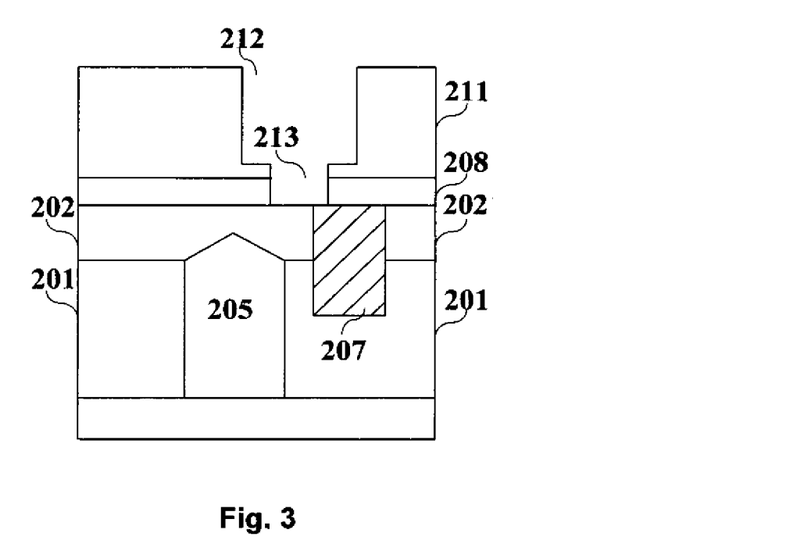
FIG. 3 is a cross-sectional view schematically showing a technical effect of a semiconductor device manufacturing method incorporating features of the present invention.

FIG. 3 schematically shows an embodiment where said second trench 212 and said second through hole 213 are not aligned with said first conductive material 207.

As shown in FIG. 3, although said second trench 212 and said second through hole 213 are not aligned with said first conductive material 207, said second through hole 213 still will not reach the air gap 205 when it comes into contact with said first conductive material 207 because the top end of the air gap 205 that is located by said first dielectric layer 201 is lower than the top end of said first conductive material 207, and thus said second through hole 213 will not communicate with said air gap 205. Thus, the low-dielectric-constant characteristic of said air gap 205 can be ensured, and good electrical connection between said first conductive material 207 and said second conductive material 217 can be maintained.

FIGS. 4a-4e are cross-sectional views schematically showing a process flow of another example of a semiconductor device manufacturing method incorporating features of the present invention. Various process methods, materials, configurations and parameters and the like in the examples described with reference to FIGS. 2a-2i can likewise be applied to similar steps in the example shown in FIGS. 4a-4e.

Figure 4A:
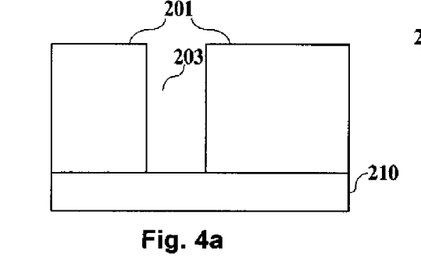
FIGS. 4a-4e are cross-sectional views schematically showing a process flow of another example of a semiconductor device manufacturing method incorporating features of the present invention.
Figure 4B:
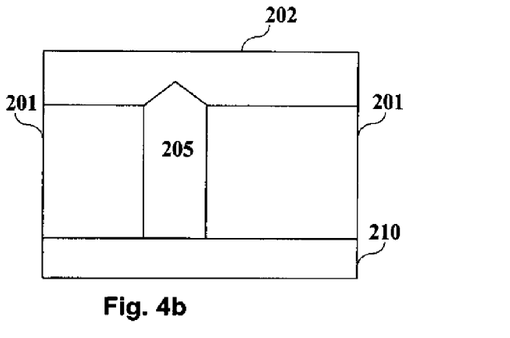
Figure 4C:
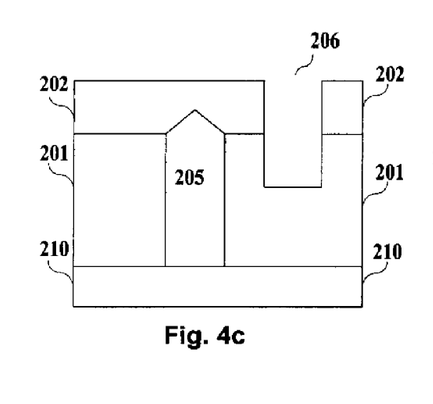
Figure 4D:
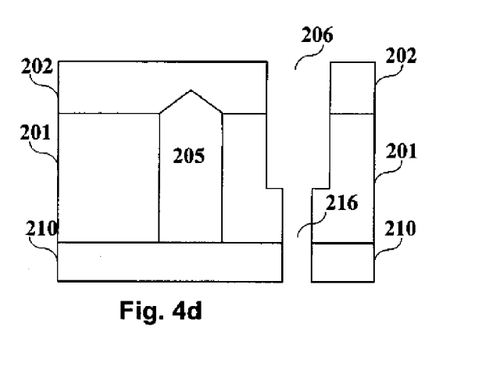
Figure 4E:
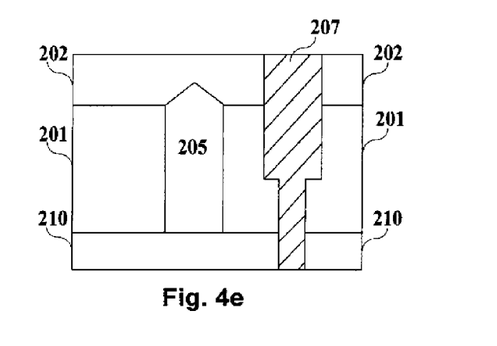

As shown in FIG. 4a, a semiconductor device manufacturing method according to the present invention can comprise step (a) in which a first dielectric layer 201 is etched to form a recess 203, wherein said first dielectric layer 201 is formed of a first dielectric material. As shown in FIG. 4b, after step (a), step (b) can be carried out in which a second dielectric material is deposited over said first dielectric layer 201 and said recess 203 to form a second dielectric layer 202, such that said recess 203 is enclosed by said first dielectric layer 201 and said second dielectric layer 202 to form an air gap 205. As shown in FIG. 4c, after step (b), step (c) can be carried out in which etching is performed such that a first trench 206 is formed in said first dielectric layer 201 and said second dielectric layer 202, adjacent to said air gap 205. As shown in FIG. 4d, after step (c), step (j) can be carried out in which etching is performed continuously from the first trench 206 to form a first through hole 216, wherein the first trench 206 and the first through hole 216 communicate with each other and penetrate the first dielectric layer 201 and the second dielectric layer 202. As shown in FIG. 4e, after the step (j), step (l) can be carried out in which a first conductive material 207 can be filled into the first trench 206 and the first through hole 216. The first trench 206 which is filled with the first conductive material 207, can constitute a wiring, and the first through hole 206, which is filled with the first conductive material 207, can constitute a conductive material via.

According to a possible exemplary implementation, before step (a), said first dielectric layer 201 can be formed on a first blocking layer 210. For example, said first dielectric layer 201 can be formed on the first blocking layer by means of chemical vapour deposition. The first blocking layer 210 can be of the same material as that for the aforementioned second blocking layer 208. For example, the first blocking layer 210 can be at least one of silicon nitride, silicon carbide, carbon-containing silicon nitride and nitrogen-containing silicon carbide. The first blocking layer 210 can be formed using a method such as physical vapour deposition. At the time the etching is performed to form the recess 203 in the step (a), the recess 203 does not penetrate said first blocking layer 210.

According to a possible exemplary implementation, the first through hole 216 formed in step (j) can penetrate the first blocking layer 210.

According to a possible exemplary implementation, after the above described steps (a), (b), (c), (j) and (l), the processes described with reference to FIGS. 2e-2i can be performed.

As shown in the method of FIGS. 2a-2i, the top end of the formed first conductive material 207 can be higher than the top end of the air gap 205. Since the through hole for forming the other conductive material via that is to be interconnected with the first conductive material 207 is etched to the level of the top end of the conductive material 207, this through hole will not be etched so as to communicate with the air gap even if this through hole is not aligned with the first conductive material 207. As such, it is possible to keep the air gap with a good low-dielectric-constant characteristic.

FIGS. 5a-5d are cross-sectional views schematically showing a process flow of another example of the semiconductor device manufacturing method according to the present invention. Various process methods, materials, configurations and parameters in the examples described with reference to FIGS. 2a-2i and FIGS. 4a-4e can likewise be applied to similar steps in the examples shown in FIGS. 5a-5d.

Figure 5A:
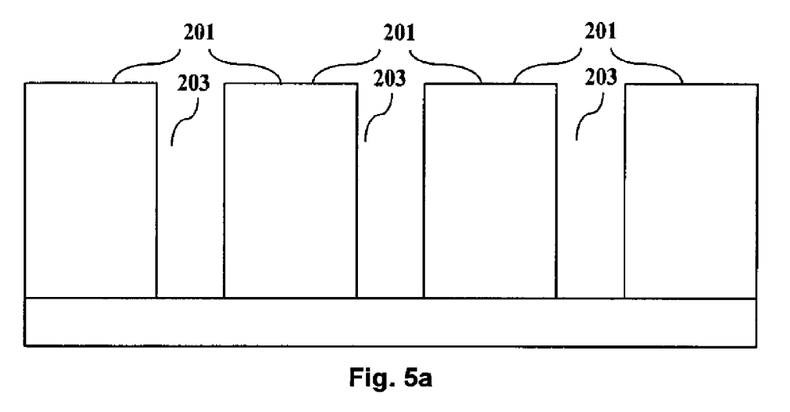
FIGS. 5a-5d are cross-sectional views schematically showing a process flow of a further example of a semiconductor device manufacturing method incorporating features of the present invention.
Figure 5B:
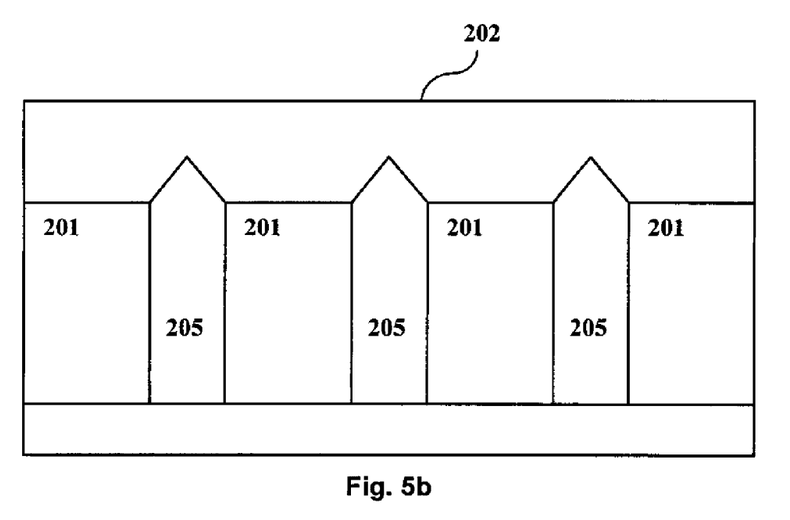
Figure 5C:
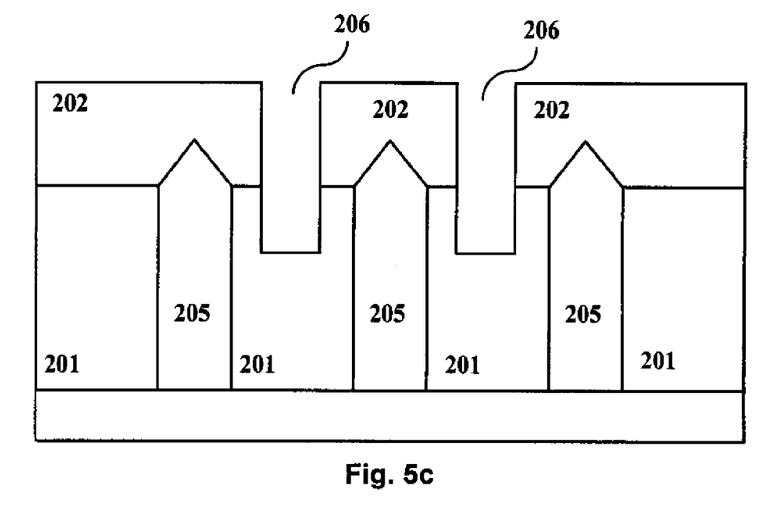

As shown in FIG. 5a, the method can, for example, comprise step (a) in which a first dielectric layer 201 is etched to form a plurality of recesses 203, wherein said first dielectric layer 201 is formed of a first dielectric material. As shown in FIG. 5b, after step (a), step (b) can be carried out in which a second dielectric material is deposited over said first dielectric layer 201 and said plurality of recesses 203 to form a second dielectric layer 202, such that said plurality of recesses 203 are enclosed by said first dielectric layer 201 and said second dielectric layer 202 to form multiple air gaps 205. As shown in FIG. 5c, after step (b), step (c) can be carried out in which etching is performed such that first trenches 206 are formed in said first dielectric layer 201 and said second dielectric layer 202 between adjacent air gaps 205 of said multiple air gaps 205.

Figure 5D:
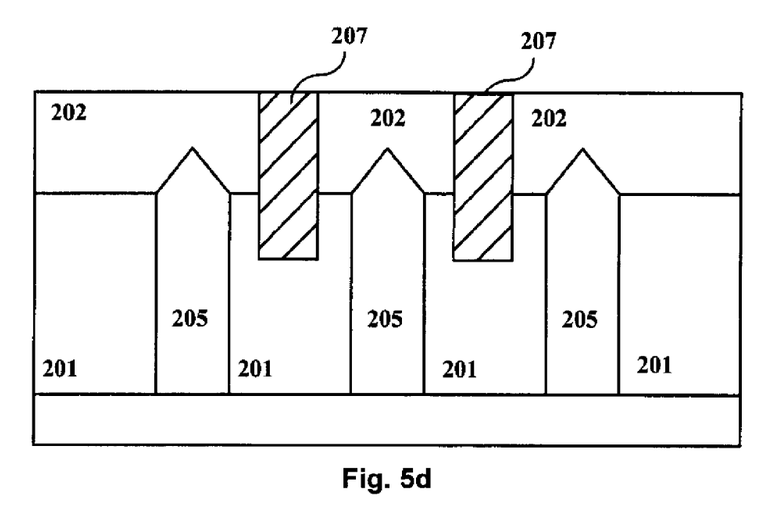

As shown in FIG. 5d, it is also possible to carry out step (d) in which a first conductive material 207 is filled into the first trenches 206.

Although three air gaps 205 and two first trenches 206 to be filled with the first conductive material 207 are shown in FIGS. 5a-5d, the numbers of the air gaps 205 and first trenches 206 shown are examples and do not limit the quantity thereof that may be formed.

With the semiconductor device manufacturing method shown in FIGS. 5a-5e, multiple air gaps 205 can be formed simultaneously, and wirings can be formed between adjacent air gaps 205. As with to the method described in the aforementioned examples, the top end of the formed first conductive material 207 can be higher than the top ends of the air gaps 205. As such, it is possible to keep the good low-dielectric-constant characteristic of the air gap.

FIGS. 6a-6e are cross-sectional views schematically showing a process flow of a further example of a semiconductor device manufacturing method according to the present invention. Various process methods, materials, configurations and parameters in the examples described with reference to FIGS.

2a-2i, FIGS. 4a-4e and FIGS. 5a-5d can likewise be applied to similar steps in the examples shown in FIGS. 6a-6e.

Figure 6A:
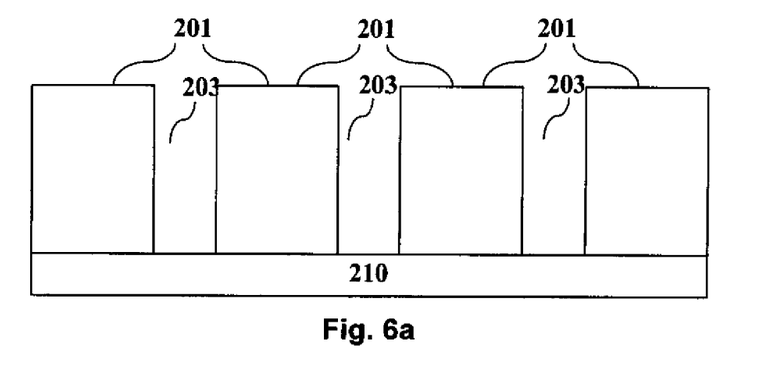
FIGS. 6a-6e are cross-sectional views schematically showing a process flow of a further another example of a semiconductor device manufacturing method incorporating features of the present invention.
Figure 6B:
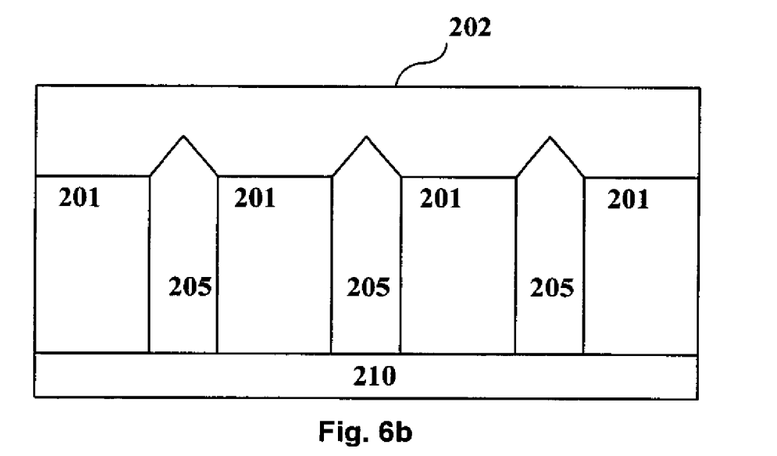
Figure 6C:
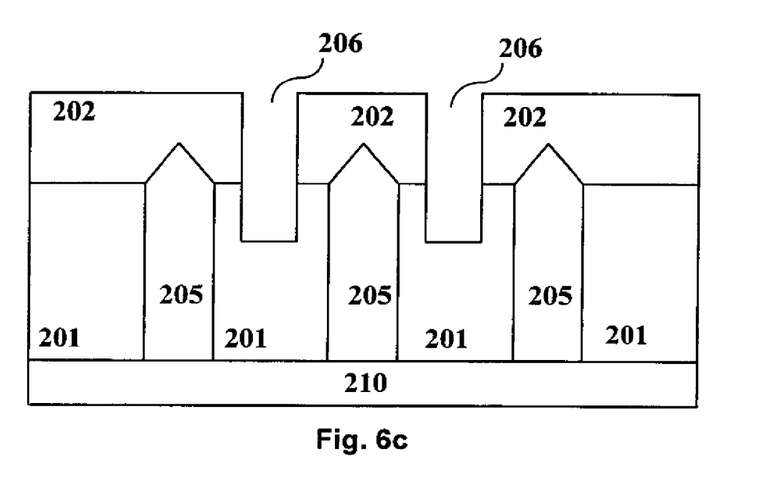

For example, as shown in FIG. 6a, the method can comprise step (a) in which a first dielectric layer 201 is etched to form a plurality of recesses 203, wherein said first dielectric layer 201 is formed of a first dielectric material. As shown in FIG. 6b, after the step (a), step (b) can be carried out in which a second dielectric material is deposited over said first dielectric layer 201 and said plurality of recesses 203 to form a second dielectric layer 202, such that said plurality of recesses 203 are enclosed by said first dielectric layer 201 and said second dielectric layer 202 to form multiple air gaps 205. As shown in FIG. 6c, after the step (b), step (c) can be carried out in which etching is performed such that first trenches 206 are formed in said first dielectric layer 201 and said second dielectric layer 202 between adjacent air gaps 205 of said multiple air gaps 205.

Figure 6D:
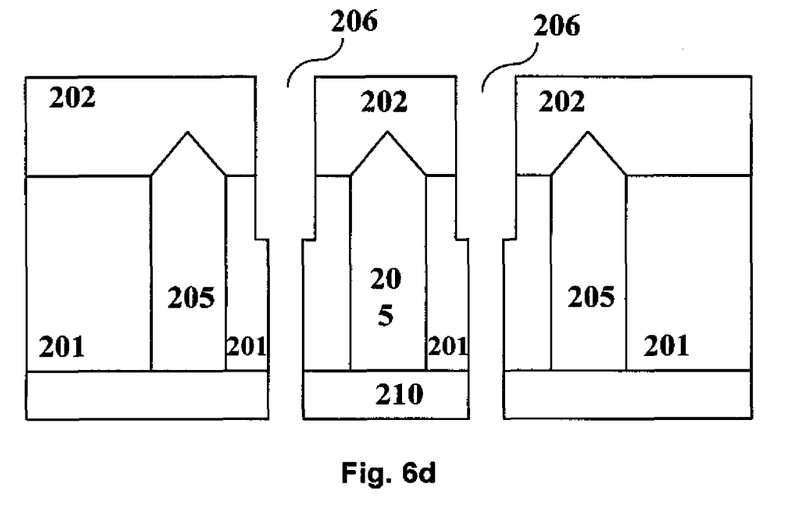
Figure 6E:
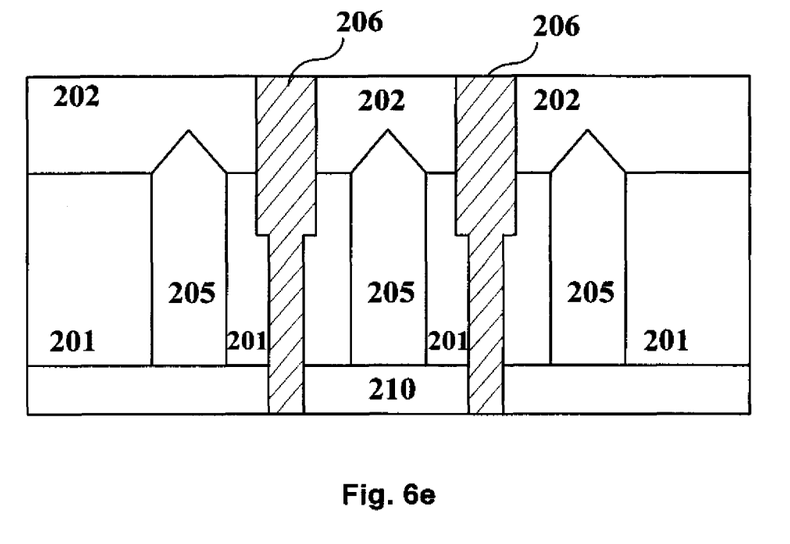

As shown in FIG. 6d, the method also can comprise step (j) in which etching is performed continuously from the first trenches 206 to form through holes 216, wherein the first trenches 206 and the through holes 216 communicate with one another and penetrate the first dielectric layer 201 and the second dielectric layer 202. As shown in FIG. 6e, the method can also comprise step (l) in which a first conductive material 207 is filled into the first trenches 206 and the through holes 216.

According to a possible exemplary implementation, before the step (a), said first dielectric layer 201 can be formed on a first blocking layer 210. The through holes 216 formed in the step (j) can penetrate the first blocking layer 210.

According to a possible exemplary implementation, after the process steps described above with reference to FIGS. 5a-5d and FIGS. 6a-6e, the processes described with reference to FIGS. 2e-2i can be performed, wherein a plurality of second trenches 212 and second through holes 213 can be formed as aligned with the plurality of the first trenches 206.

Although some specific embodiments of the present invention have been demonstrated in detail with examples, it should be understood by a person of ordinary skill in the art that the above examples are only intended to be illustrative and not to limit the scope of the present invention. It should be understood by a person of ordinary skill in the art that the above embodiments can be modified without departing from the scope and spirit of the present invention. The scope of the present invention is defined by the attached claims.

What is claimed is:

1. A semiconductor device manufacturing method, comprising:
   (a) etching a first dielectric layer to form a recess, wherein said first dielectric layer is formed of a first dielectric material;
   (b) depositing a second dielectric material over said first dielectric layer and said recess to form a second dielectric layer, such that said recess is enclosed by said first dielectric layer and said second dielectric layer to form a space;
   (c) forming a first trench in said first dielectric layer and said second dielectric layer, adjacent to but separate from any space, while maintaining the space undamaged as an air gap;
   (d) further etching said first trench to form a first through hole, wherein said first trench and said first through hole that communicate with each other penetrate said first dielectric layer and said second dielectric layer;
   (e) filling a first conductive material into said first trench and said first through hole to form a conductive material via;
   (f) performing a chemical mechanical planarization on said first conductive material such that a surface obtained through the planarization is higher than the top end of said air gap;
   (g) forming a second blocking layer on the surface obtained through said chemical mechanical planarization;
   (h) forming a third dielectric layer on said second blocking layer;
   (i) etching said third dielectric layer to form a second trench and a second through hole that communicates with said second trench, wherein said second trench and said second through hole penetrate said third dielectric layer and said second blocking layer, and the lower end of said second through hole is substantially flush with the top end of said first conductive material; and
   (j) filling a second conductive material into said second trench and said second through hole.

2. The method of claim 1 further comprising:
   prior to step (a), forming said first dielectric layer on a first blocking layer,
   wherein the first through hole formed in step (d) penetrates said first blocking layer.

3. A semiconductor device manufacturing method, comprising:
   (a) etching a first dielectric layer to form a plurality of recesses, wherein said first dielectric layer is formed of a first dielectric material;
   (b) depositing a second dielectric material over said first dielectric layer and said plurality of recesses to form a second dielectric layer, such that said plurality of recesses are enclosed by said first dielectric layer and said second dielectric layer to form multiple spaces;
   (c) forming, first trenches in said first dielectric layer and said second dielectric layer between adjacent spaces but separate from any spaces of said multiple spaces while maintaining the spaces undamaged as air gaps;
   (d) further etching said first trenches to form through holes, wherein said first trenches and said through holes that communicate with each other penetrate said first dielectric layer and said second dielectric layer;
   (e) filling a first conductive material into said first trenches and said through holes to form conductive material vias;
   (f) performing a chemical mechanical planarization on said first conductive material such that a surface obtained through the planarization is higher than the top ends of said air gaps;
   (g) forming a second blocking layer on the surface obtained through said chemical mechanical planarization;
   (h) forming a third dielectric layer on said second blocking layer;
   (i) etching said third dielectric layer to form a second trench and a second through hole that communicates with said second trench, wherein said second trench and said second through hole penetrate said third dielectric layer and said second blocking layer, and the lower end of said second through hole is substantially flush with the top end of said first conductive material; and
   (j) filling a second conductive material into said second trench and said second through hole.

4. The method of claim 3 further comprising:
   prior to step (a), forming said first dielectric layer on a first blocking layer,
   wherein the through holes formed in step (d) penetrate said first blocking layer.

* * * * *